(12) United States Patent
Cheng

(10) Patent No.: US 8,679,906 B2
(45) Date of Patent: Mar. 25, 2014

(54) ASYMMETRIC MULTI-GATED TRANSISTOR AND METHOD FOR FORMING

(75) Inventor: Kangguo Cheng, Beacon, NY (US)

(73) Assignee: International Business Machines Corporation, Armonk, NY (US)

(*) Notice: Subject to any disclaimer, the term of this patent is extended or adjusted under 35 U.S.C. 154(b) by 559 days.

(21) Appl. No.: 12/612,035

(22) Filed: Nov. 4, 2009

(65) Prior Publication Data

US 2010/0044794 A1  Feb. 25, 2010

Related U.S. Application Data

(62) Division of application No. 11/558,977, filed on Nov. 13, 2006, now abandoned.

(51) Int. Cl.
*H01L 21/338* (2006.01)

(52) U.S. Cl.
USPC ............ 438/164; 438/39; 438/137; 438/157; 438/174; 438/514; 257/21; 257/308; 257/427; 257/722; 257/E29.264

(58) Field of Classification Search
USPC ............... 257/21, 308, 427, 722, E29.264, 257/E29.275, E29.319, E21.409, E21.421; 438/39, 74, 137, 138, 157, 164, 174, 438/192, 206, 286, 319, 336, 514, 438/FOR. 123, FOR. 145, FOR. 154, 438/FOR. 175, FOR. 190
See application file for complete search history.

(56) References Cited

U.S. PATENT DOCUMENTS

| | | | |
|---|---|---|---|
| 5,047,816 A | 9/1991 | Cuevas | |
| 6,372,559 B1 | 4/2002 | Crowder et al. | |
| 6,458,662 B1 | 10/2002 | Yu | |
| 6,610,576 B2 | 8/2003 | Nowak | |
| 6,674,139 B2 * | 1/2004 | Mandelman et al. | 257/412 |
| 6,680,226 B2 | 1/2004 | Efland et al. | |
| 6,787,878 B1 | 9/2004 | Nagai et al. | |
| 6,800,885 B1 | 10/2004 | An et al. | |

(Continued)

FOREIGN PATENT DOCUMENTS

| | | |
|---|---|---|
| JP | 2005-045245 | 2/2005 |
| JP | 2005-521258 | 7/2005 |
| JP | 2005-317978 | 11/2005 |
| WO | 2005-074036 | 8/2005 |

OTHER PUBLICATIONS

Cheng, U.S. Appl. No. 11/558,977, filed Nov. 13, 2006, Office Action dated Sep. 19, 2008, 8 pages.

(Continued)

*Primary Examiner* — Alexander Sofocleous
*Assistant Examiner* — Joannie A Garcia
(74) *Attorney, Agent, or Firm* — Joseph J. Petrokaitis; Hoffman Warnick LLC

(57) ABSTRACT

In one embodiment, there is an asymmetric multi-gated transistor that has a semiconductor fin with a non-uniform doping profile. A first portion of the fin has a higher doping concentration while a second portion of the fin has a lower doping concentration. In another embodiment, there is an asymmetric multi-gated transistor with gate dielectrics formed on the semiconductor fin that vary in thickness. This asymmetric multi-gated transistor has a thin gate dielectric formed on a first side portion of the semiconductor fin and a thick gate dielectric formed on a second side portion of the fin.

19 Claims, 12 Drawing Sheets

(56) References Cited

U.S. PATENT DOCUMENTS

| | | | |
|---|---|---|---|
| 6,800,905 B2 | 10/2004 | Fried et al. | |
| 6,841,834 B2 | 1/2005 | Nowak | |
| 6,849,884 B2 * | 2/2005 | Clark et al. | 257/192 |
| 6,974,729 B2 | 12/2005 | Collaert et al. | |
| 7,098,507 B2 | 8/2006 | Tang et al. | |
| 7,202,517 B2 * | 4/2007 | Dixit et al. | 257/287 |
| 2002/0102827 A1 | 8/2002 | Chen | |
| 2003/0113970 A1 | 6/2003 | Fried et al. | |
| 2005/0035415 A1 * | 2/2005 | Yeo et al. | 257/401 |
| 2005/0110085 A1 | 5/2005 | Zhu et al. | |
| 2005/0148137 A1 * | 7/2005 | Brask et al. | 438/216 |
| 2006/0014331 A1 | 1/2006 | Tang et al. | |
| 2006/0228840 A1 * | 10/2006 | Chau et al. | 438/164 |
| 2006/0249784 A1 * | 11/2006 | Black et al. | 257/327 |
| 2007/0075351 A1 * | 4/2007 | Schulz et al. | 257/314 |
| 2007/0131972 A1 * | 6/2007 | Li | 257/213 |
| 2007/0158700 A1 * | 7/2007 | Koh et al. | 257/288 |
| 2007/0158762 A1 * | 7/2007 | Anderson et al. | 257/401 |

OTHER PUBLICATIONS

Cheng, U.S. Appl. No. 11/558,977, filed Nov. 13, 2006, Office Action dated Aug. 4, 2009, 10 pages.

Cheng, U.S. Appl. No. 11/558,977, filed Nov. 13, 2006, Office Action dated May 1, 2008, 16 pages.

Cheng, U.S. Appl. No. 11/558,977, filed Nov. 13, 2006, Office Action dated Feb. 20, 2009, 7 pages.

Cheng, U.S. Appl. No. 11/558,977, filed Nov. 13, 2006, Office Action dated Feb. 27, 2008, 20 pages.

* cited by examiner

ASYMMETRIC MULTI-GATED TRANSISTOR AND METHOD FOR FORMING

CROSS-REFERENCE TO RELATED APPLICATIONS

This application is a divisional of co-pending U.S. patent application Ser. No. 11/558,977, filed Nov. 13, 2006. The application identified above is incorporated herein by reference in its entirety to provide continuity of disclosure.

BACKGROUND OF THE INVENTION

1. Technical Field

This disclosure generally relates to semiconductor devices, and more specifically to asymmetric multi-gated transistors and methods for forming.

2. Background

The use of multi-gated transistors is one option that semiconductor manufacturers have proposed to facilitate continuing scaling of complementary metal-oxide semiconductor (CMOS) technology. A multi-gated transistor which has gates placed on multiple sides of the transistor, allows smaller device dimensions and higher electrical current that can be switched at higher speeds. One type of multi-gated transistor is a fin field effect transistor (FinFET) that has multiple gates surrounding a semiconductor fin. A typical multi-gated FinFET has a symmetric structure and fixed device characteristics. However, for some applications, it is desirable to have an asymmetric multi-gated FinFET. Depending on the power supply, the characteristics of the asymmetric FinFET can be adjusted to achieve an optimal tradeoff between power consumption and device performance. For example, when the FinFET is powered by a battery, low power consumption requirements usually overweigh performance requirements. On the other hand, when the FinFET is powered by an external AC supply, high performance is usually desired.

A drawback with currently available asymmetric multi-gated FinFETs is that the methods to form these transistors are complicated and costly. For instance, these methods usually require an extra masking level and/or are complicated processes.

SUMMARY

Therefore, there is a need for an improved asymmetric multi-gated FinFET and method for forming.

In one embodiment, there is an asymmetric multi-gated transistor. In this embodiment, the asymmetric multi-gated transistor comprises a substrate and a semiconductor fin formed on the substrate. The semiconductor fin is asymmetrically doped with a semiconductor dopant. A first side portion of the fin has a high doping concentration and a second side portion opposite therefrom has a lower doping concentration. The asymmetric multi-gated transistor further comprises a gate dielectric formed on the fin. The gate dielectric comprises a first gate dielectric formed on the first side portion of the fin having a high doping concentration and a second gate dielectric formed on the second side portion of the fin having a lower doping concentration. The asymmetric multi-gated transistor also comprises a first gate conductor formed on the first gate dielectric and a second gate conductor formed on the second gate dielectric.

In another embodiment, there is a method for forming an asymmetric multi-gated transistor. In this embodiment, the method comprises forming a semiconductor fin on a substrate. The method also comprises asymmetrically doping the semiconductor fin with a semiconductor dopant. The asymmetrically doping comprises doping a first side portion of the fin with a high doping concentration of dopants and doping second side portion of the fin with a lower doping concentration. The method further comprises forming a gate dielectric on the fin. The forming of the gate dielectric comprises forming a first gate dielectric on the first side portion of the fin having a high doping concentration and forming a second gate dielectric on the second side portion of the fin having a lower doping concentration. The method of this embodiment further comprises forming a first gate conductor on the first gate dielectric and forming a second gate conductor on the second gate dielectric.

In a third embodiment, there is a method for forming an asymmetric multi-gated transistor. In this embodiment, the method comprises forming a semiconductor fin on a substrate. The method also comprises incorporating a first side portion of the semiconductor fin with an implant material. The method of this embodiment also comprises growing a gate dielectric on the semiconductor fin. The first side portion of the semiconductor fin with the implant material grows a first gate dielectric with a thickness that differs from a thickness of a second gate dielectric that grows on second side portion of the semiconductor fin. The method of this embodiment further comprises forming a first gate conductor on the first gate dielectric and forming a second gate conductor on the second gate dielectric.

DETAILED DESCRIPTION

Figure 1A:
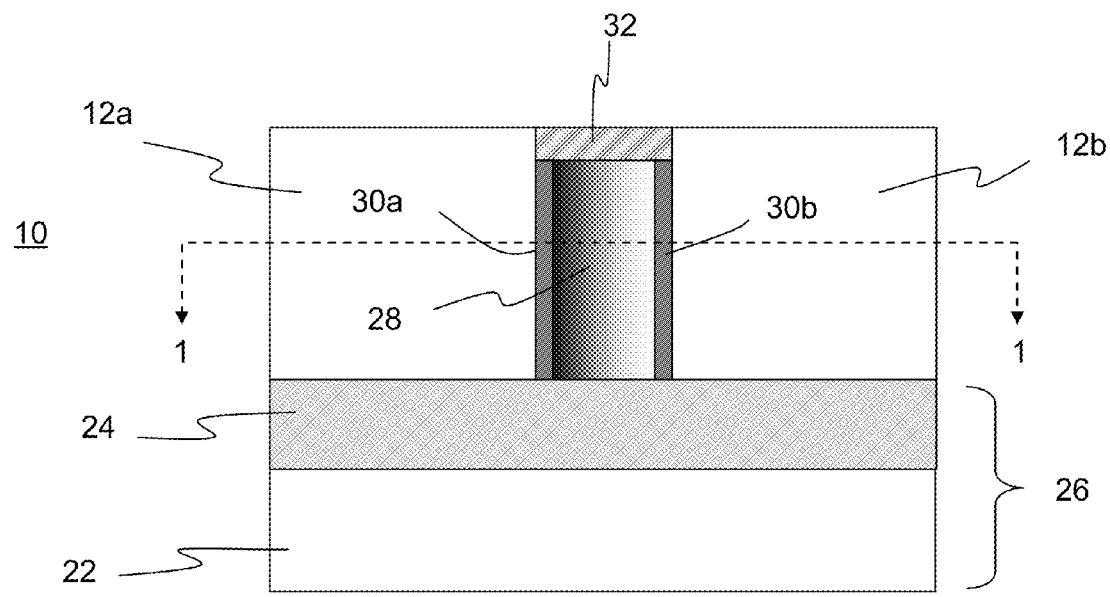
FIGS. 1a-1b show a cross-sectional and top view, respectively, of an asymmetric multi-gated transistor according to a first embodiment of this disclosure.
Figure 1B:
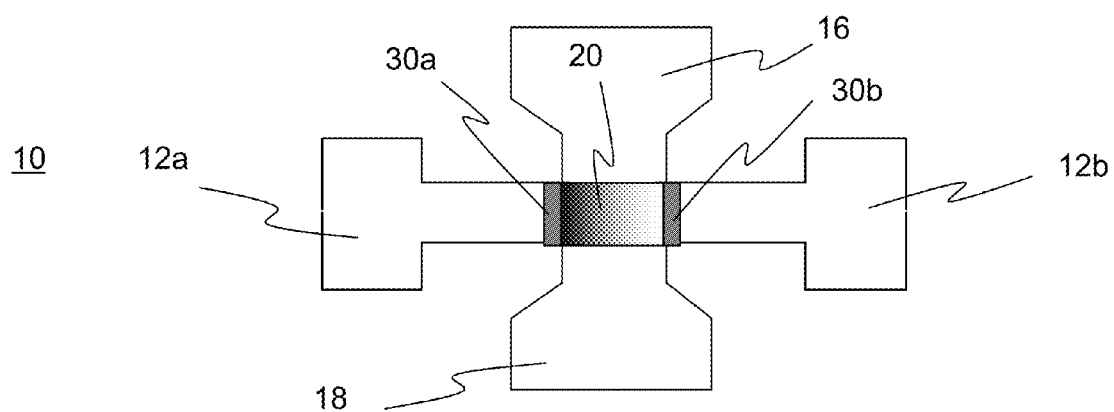

FIGS. 1a-1b shows an asymmetric multi-gated transistor 10 according to a first embodiment of the present invention. The asymmetric multi-gated transistor 10 is asymmetric because the doping profile in the semiconductor fin of the transistor is non-uniform. That is, one portion of the fin has a higher doping concentration while an opposite portion of the fin has a lower doping concentration. This results in one transistor on one side of the asymmetric multi-gated transistor having a different threshold voltage (Vt) from the other transistor on the other side of the asymmetric multi-gated transistor, wherein the Vt is the voltage needed to turn on the transistor. The transistor with the high Vt is suitable for use in low-power applications, while the transistor with the low Vt is suitable for use in high-performance applications.

Referring back to the drawings, FIG. 1a shows a cross-sectional view of the asymmetric multi-gated transistor 10. FIG. 1a shows the asymmetric multi-gated transistor 10 formed on a semiconductor-on-insulator (SOI) substrate which comprises a substrate layer 22, a buried oxide (BOX) layer 24. In addition, atop of the BOX layer 24 there is a semiconductor layer on which the semiconductor fin 28 is formed (not shown). The substrate layer 22 may comprise any semiconductor material, including but not limited to silicon, germanium, silicon germanium, silicon carbide, aluminum oxide, and those consisting essentially of one or more III-V or II-VI compound semiconductors. The BOX layer 24 may comprise any insulating material, including but not limited to, silicon oxide, silicon nitride, silicon oxynitride, high-k material having a relative permittivity above about 7, or any combination of these materials. The substrate layer 22 and the BOX layer 24 form a substrate 26 in which the additional layers of the asymmetric multi-gated transistor 10 are formed on.

As shown in FIG. 1a, the asymmetric multi-gated transistor 10 further comprises a semiconductor fin 28 formed on the substrate 26. The semiconductor fin may comprises any suitable semiconductor material, including but not limited to silicon, germanium, silicon germanium, silicon carbide, aluminum oxide, and those consisting essentially of one or more III-V or II-VI compound semiconductors. In one embodiment, the semiconductor fin 28 comprises single crystalline silicon. The semiconductor fin 28 is not limited to the shape shown in FIG. 1a and can take the form of other shapes such as a pillar or column shape. The semiconductor fin 28 is asymmetrically doped with a semiconductor dopant, wherein one side portion of the fin has a high doping concentration and a side portion opposite therefrom has a lower doping concentration. In one embodiment, the semiconductor dopant comprises a dopant selected from the group consisting of n-type dopants such as phosphorus (P), arsenic (As) and antimony (Sb). In another embodiment, the semiconductor dopant comprises a dopant selected from the group consisting of p-type dopants such as boron (B), boron fluoride ($BF_2$), gallium (Ga), indium (In), and thallium (Tl).

FIG. 1a illustrates the non-uniform doping profile of the fin by showing that the left-hand side portion of the semiconductor fin 28 is more shaded than the right-hand side portion of the fin. The left-hand side portion of the semiconductor fin 28 with more shading is representative of a higher doping concentration, while the right-hand side portion of the fin with less shading is representative of a lower doping concentration. The positioning of the higher doping concentration on the left-hand side of the semiconductor fin 28 and the lower doping concentration on the right-hand side of the fin is only for illustration purposes and is not limiting on which part of the fin can have the higher and lower doping concentrations. The side portion of the semiconductor fin 28 with the higher doping concentration has a doping concentration preferably ranging from $1E15\ cm^{-3}$ to $1E20\ cm^{-3}$, more preferably ranging from $1E17\ cm^{-3}$ to $1E19\ cm^{-3}$, and most preferably ranging from $5E17\ cm^{-3}$ to $5E18\ cm^{-3}$. The side portion of the fin with the lower doping concentration has a doping concentration preferably less than $1E18\ cm^{-3}$, more preferably less than $1E17\ cm^{-3}$, and most preferably less than $1E16\ cm^{-3}$. In one embodiment, the doping concentration changes gradually from the one side portion of the fin to the other side portion of the fin. In another embodiment, dopants are localized only in one side portion of the fin.

Referring back to FIG. 1a, the asymmetric multi-gated transistor 10 further comprises a gate dielectric (first gate dielectric 30a and second gate dielectric 30b) formed on the semiconductor fin 28. The first gate dielectric 30a is formed on the sidewall of one side portion of the semiconductor fin 28 having a high doping concentration and the second gate dielectric 30b is formed on the sidewall of the opposite side portion of the fin having a lower doping concentration. Formed above the semiconductor fin 28 is a capping layer 32 that covers a top portion of each of the first gate dielectric 30a, semiconductor fin 28 and second gate dielectric 30b. The capping layer 32 aids in pattern optimization and protects the semiconductor fin 28 during subsequent processing. Materials suitable for capping layer 32 include but are not limited to, silicon oxide, silicon nitride, silicon oxynitride, silicon carbide, amorphous carbon and any combination thereof. In one embodiment, the capping layer 32 comprises silicon nitride.

Formed on the substrate 26, on one side of the first gate dielectric 30a and the capping layer 32 is a first gate conductor 12a, while on the other side of the second gate dielectric 30b and the capping layer 32 is a second gate conductor 12b. In FIG. 1a, since the left-hand side portion of the semiconductor fin 28 has a higher doping concentration as compared to the right-hand side portion of the fin, the transistor 10 will have a high Vt when controlled by the first gate conductor 12a and a low Vt when controlled by the second gate conductor 12b.

FIG. 1b shows a top view of the asymmetric multi-gated transistor 10 taken along cut line 1-1 shown in FIG. 1a. FIG. 1b shows that the semiconductor fin 28 comprises a channel region 20, a source region 16 and a drain region 18. The channel region 20, the source region 16, the drain region 18, two gate dielectrics 30a and 30b, and two gate conductors 12a and 12b form the asymmetric multi-gated transistor 10.

Figure 2A:
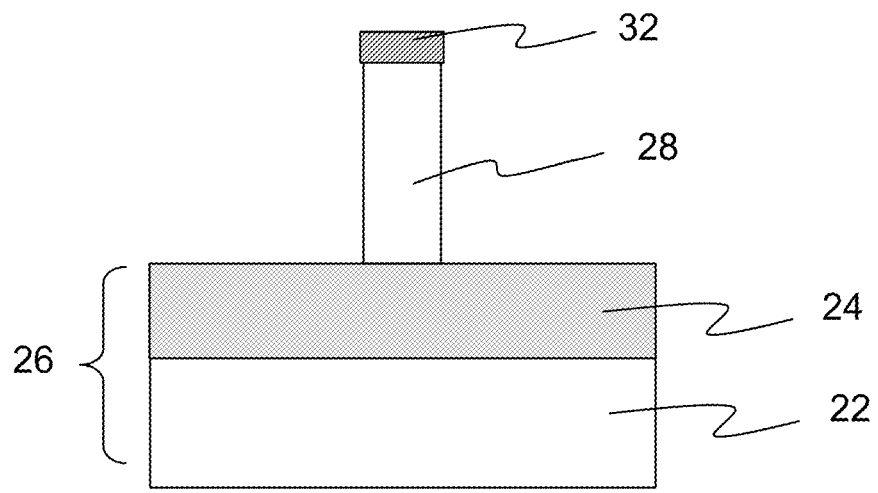
FIGS. 2a-2d show the method for forming the asymmetric multi-gated transistor depicted in FIGS. 1a-1b.

FIGS. 2a-2d show the method for forming the asymmetric multi-gated transistor 10 depicted in FIGS. 1a-1b. The method for forming the asymmetric multi-gated transistor 10 begins by providing a wafer. In one embodiment, the wafer comprises an SOI wafer but may include bulk silicon. As shown in FIG. 2a, the initial structure for forming the asymmetric multi-gated transistor 10 comprises a semiconductor fin 28 formed on the SOI layer of the SOI wafer (not shown). BOX layer 24 and the substrate layer 22 underlying the SOI layer form the substrate 26. The substrate layer 22 and the semiconductor fin 28 can comprise any semiconductor material, including but not limited to silicon, germanium, silicon germanium, silicon carbide, polycrystalline silicon, and those consisting essentially of one or more III-V or II-VI compound semiconductors. The BOX layer 24 can comprise any insulating material, including but not limited to, silicon oxide, silicon nitride, silicon oxynitride, high-k material having a relative permittivity above about 7, or any combination of these materials. In one embodiment, both the semiconductor fin 28 and the substrate layer 22 comprise silicon. In one embodiment, the substrate layer 22 has a thickness preferably ranging from about 200 micrometers to about 1000 micrometers, and more preferably ranging from about 500 micrometers to about 750 micrometers. The BOX layer 24 has a thickness preferably ranging from about 30 nanometers to about 3000 nanometers, and more preferably ranging from about 100 nanometers to about 150 nanometers.

FIG. 2a further shows the capping layer 32 formed on top of the fin. In one embodiment, the capping layer 32 comprises a dielectric material such as oxide, nitride, oxynitride, or multilayer thereof. The height and thickness of the semiconductor fin 28 and the capping layer 32 can vary according to the application of the asymmetric multi-gated transistor 10. In one embodiment, the semiconductor fin 28 has a height preferably ranging from about 30 nanometers to about 200 nanometers, and more preferably ranging from about 50 nanometers to about 100 nanometers. In one embodiment, the semiconductor fin 28 has a width preferably ranging from about 5 nanometers to about 200 nanometers, and more preferably ranging from about 30 nanometers to about 70 nanometers. In one embodiment, the capping layer 32 has a thickness preferably ranging from about 5 nanometers to about 200 nanometers, and more preferably ranging from about 30 nanometers to about 50 nanometers.

The capping layer 32 can be formed by a conventional deposition process, including but not limited to, chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), atomic layer deposition (ALD), molecular beam epitaxy (MBE), physical vapor deposition, sputtering, plating, evaporation, ion beam deposition, electron beam deposition, laser assisted deposition. Alternatively, a conventional thermal oxidation and/or nitridation process well known to those skilled in the art can be used to grow the capping layer 32.

The structure shown in FIG. 2a is fabricated utilizing conventional processes well known to those skilled in the art. For example, conventional lithography and dry etching such as reactive-ion etching, ion beam etching, plasma-etching or laser ablation can be used for patterning the capping layer 32 and transferring the pattern in the capping layer to the underlying SOI to form the semiconductor fin 28. The lithography may include applying a photoresist (not shown) to the capping layer 32, exposing the photoresist to a pattern of radiation and developing the pattern into the photoresist using a conventional resist developer. The etching may include a single etching process or multiple etching processes using one or more of the above mentioned dry etching processes. After etching, a conventional stripping process well known to those skilled in the art removes the photoresist. Alternatively, electron beam lithography, and/or spacer imaging transfer technique can used for patterning the capping layer 32 and the semiconductor fin 28.

Figure 2B:
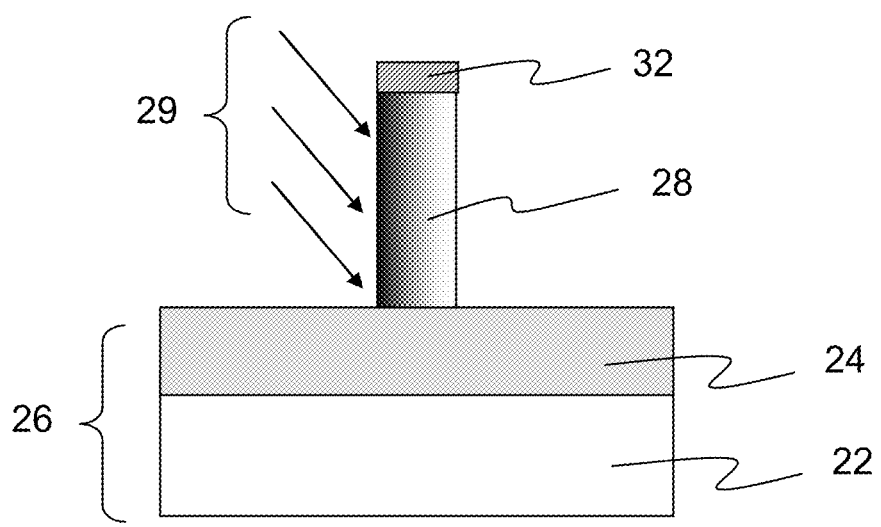

FIG. 2b shows the structure from FIG. 2a being incorporated with semiconductor dopants. In one embodiment, as indicated by the arrows 29 shown in FIG. 2b, a side portion of the semiconductor fin 28 receives an angled implantation of the semiconductor dopants, which is well known to those skilled in the art. The angled implantation facilitates asymmetric doping of the semiconductor fin 28. By asymmetrically doping the semiconductor fin 28, the side portion of the fin that receives the angled implantation will have a higher doping concentration and the side portion opposite the side receiving the angled implantation will have a lower doping concentration or no dopants. The left-hand side portion of the fin with the higher doping concentration is represented in FIG. 2b with more shading, while the side portion of the fin with lower doping concentration has less shading. The result of asymmetrically doping the semiconductor fin 28 is a fin with a non-uniform doping profile. Alternative methods instead of angle ion implantation can also be used to asymmetrically dope the semiconductor fin 28. For example, a protection layer such as a silicon nitride layer can be formed on one side portion of the semiconductor fin 28 and a semiconductor dopant is incorporated into the opposite side portion which is exposed by existing or future developed doping technique, including but not limited to, ion implantation, gas phase doping, plasma doping, plasma immersion ion implantation, infusion doping, liquid phase doping, and solid phase doping.

The type of dopant used to fabricate the asymmetric multi-gated transistor 10 will vary and depend on the application of the transistor. In one embodiment, the semiconductor dopant is an n-type dopant selected from the group consisting of phosphorus (P), arsenic (As) and antimony (Sb). In an alternative embodiment, the semiconductor dopant is a p-type dopant selected from the group consisting of boron (B), boron fluoride ($BF_2$), gallium (Ga), indium (In), and thallium (Tl). The amount of dopant used to fabricate the asymmetric multi-gated transistor 10 will vary and depend on the dopant selected and the application of the transistor. In one embodiment, the side portion of the semiconductor fin 28 with the higher doping concentration has a doping concentration preferably ranging from $1E15$ $cm^{-3}$ to $1E20$ $cm^{-3}$, more preferably ranging from $1E17$ $cm^{-3}$ to $1E19$ $cm^{-3}$, and most preferably ranging from $5E17$ $cm^{-3}$ to $5E18$ $cm^{-3}$. The side portion of the fin with the lower doping concentration has a doping concentration preferably less than $1E18$ $cm^{-3}$, more preferably less than $1E17$ $cm^{-3}$, and most preferably less than $1E16$ $cm^{-3}$. In one embodiment, the doping concentration changes gradually from the one side portion of the fin to the other side portion of the fin. In another embodiment, dopants are concentrated only in one side portion of the fin.

Depending on the doping method, an optional activation process can be performed to activate the dopant in the semiconductor fine. The activation process may comprise performing a thermal anneal process such as rapid thermal anneal, furnace anneal, and laser anneal. Alternatively, an irradiation process such as ultraviolet (UV) irradiation can be used to activate the dopant.

Figure 2C:
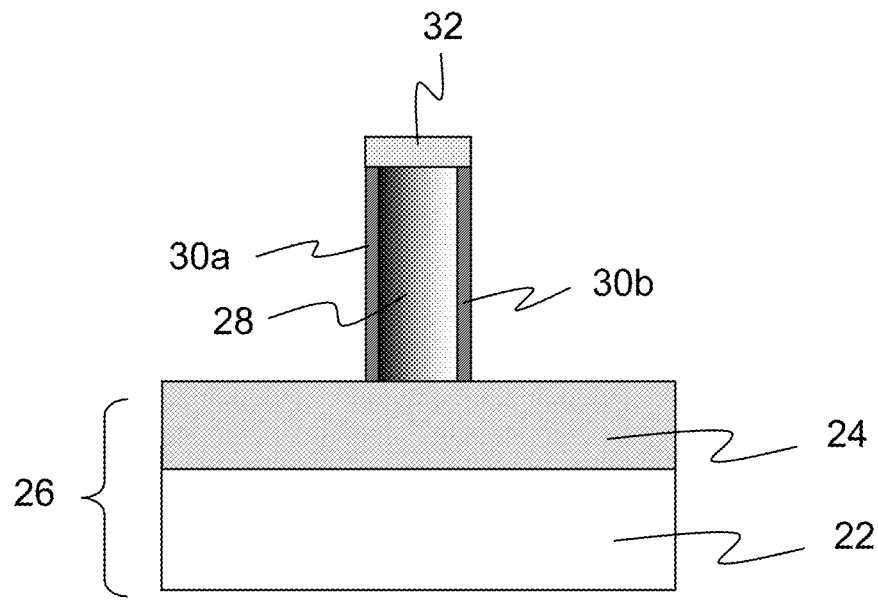

FIG. 2c shows the structure from FIG. 2b with the gate dielectric (first gate dielectric 30a and second gate dielectric 30b) formed on the semiconductor fin 28. The first gate dielectric 30a is formed on the side portion of the fin 28 having a high doping concentration and the second gate dielectric 30b is formed on the side portion of the fin having the lower doping concentration. First and second gate dielectric 30a and 30b can comprise the same or different dielectric materials, including but not limited to, silicon oxide ($SiO_2$), silicon nitride, silicon oxynitride, high-k (high dielectric constant) material having a relative permittivity above about 7, or any combination of these materials. Examples of high-k material include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, an any combination of these materials. The thickness of each gate dielectric 30a and 30b can vary. In one embodiment, the gate dielectrics each have a thickness that ranges from about 1 nanometer to about 10 nanometers.

There are various approaches in which one can form the gate dielectric on the semiconductor fin 28. Each approach will depend on the material selected for use as the gate dielectric. For example, if the gate dielectric is $SiO_2$ then one can use a conventional thermal oxidation to oxidize the surface of the sidewalls of the semiconductor fin 28 so that the $SiO_2$ can thermally grow. In another embodiment, if the gate dielectric is a high-K dielectric then one can use a conventional deposition such as atomic layer deposition (ALD), chemical vapor deposition (CVD), metalorganic chemical vapor deposition (MOCVD), and laser assisted deposition.

Figure 2D:
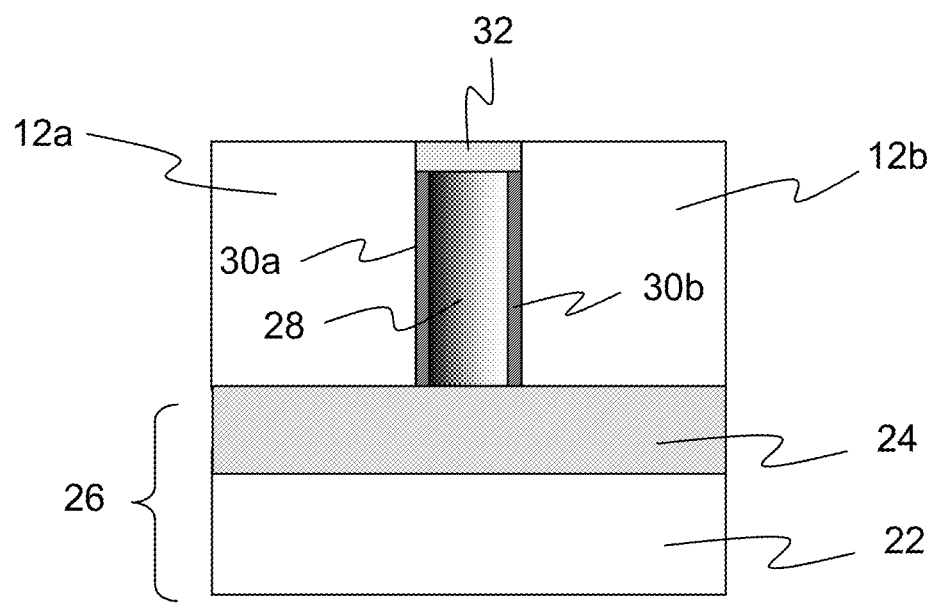

FIG. 2d shows the structure from FIG. 2c with the first gate conductor 12a and the second gate conductor 12b formed on the substrate 26, gate dielectrics 30a and 30b and the capping layer 32. The first gate conductor 12a and second gate conductor 12b comprise the same or different conducting materials selected from a group consist of polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), or any suitable combination of these materials. The height and thickness of gate conductor 12a and 12b can vary depending on the application but in most embodiments the height and thickness will correspond to the height of the semiconductor fin 28 and the capping layer 32, while the thickness will range from about 20 nanometers to 200 nanometers.

The first gate conductor 12a and the second gate conductor 12b can be formed by conventional processes such as atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition, and laser assisted deposition.

After depositing the first gate conductor 12a and the second gate conductor 12b, additional processing operations are performed on the structure in FIG. 2d in order to obtain the asymmetric multi-gated transistor 10. In one embodiment, conventional patterning (i.e., lithography) and etching remove unnecessary material from the structure shown in FIG. 2d to form a source region and drain region. After performing these processing operations, a conventional doping process such as ion implantation is performed to form the source 16 and drain 18. In one embodiment, the dopant implanted into the source 16 and drain 18 has the opposite polarity to the dopant incorporated into the channel region 20. The result is the asymmetric multi-gated transistor 10 shown in FIG. 1a.

Figure 3A:
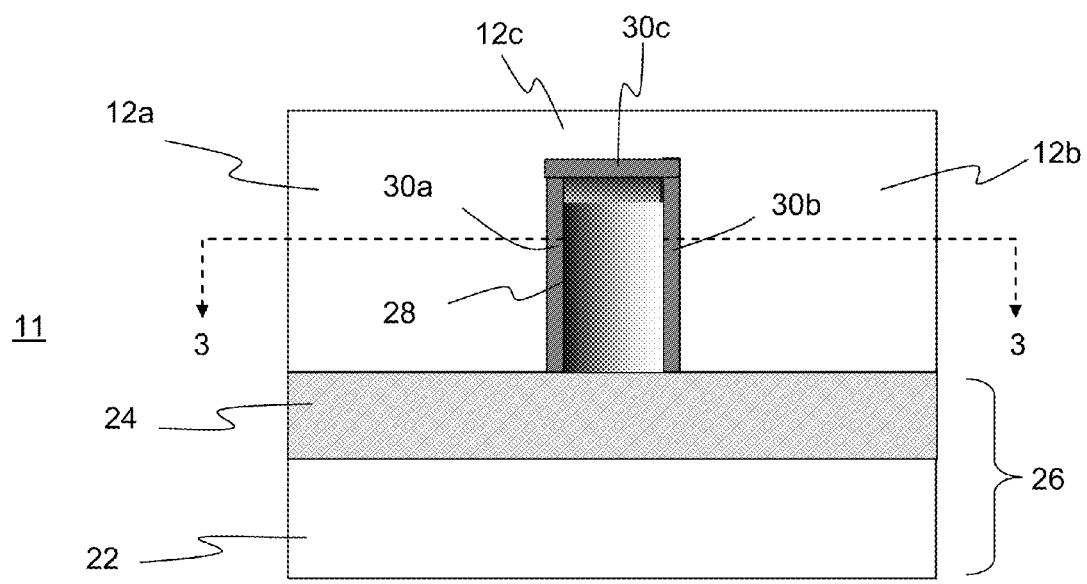
FIGS. 3a-3b show a cross-sectional and top view, respectively, of an asymmetric multi-gated transistor according to a second embodiment of this disclosure.
Figure 3B:
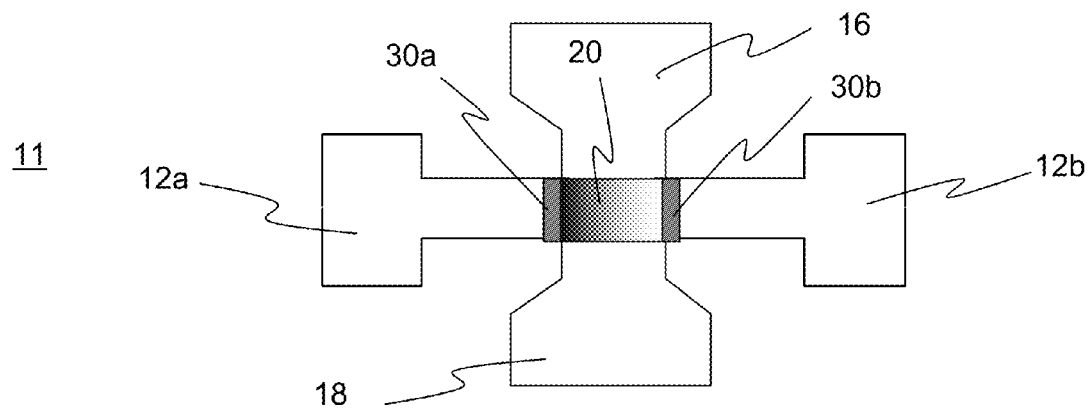

FIGS. 3a-3b show a second embodiment of the asymmetric multi-gated transistor. In particular, FIGS. 3a-3b show a tri-gated transistor 11 with asymmetric body doping. The tri-gated transistor 11 is similar to the asymmetric multi-gated transistor 10 of FIGS. 1a-1b, except that transistor 11 has three gate conductors 12a, 12b and 12c and three gate dielectrics 30a, 30b and 30c (see FIGS. 3a-3b). In this embodiment, the capping layer 32 of the transistor 10 shown in FIGS. 1a-1b has been replaced with the additional gate dielectric 30c. As shown in FIG. 3a, the doping profile in the semiconductor fin 28 of the tri-gated transistor 11 is non-uniform. In this embodiment, one side portion of the semiconductor fin 28 has a higher doping concentration while an opposite side portion of the fin has a lower doping concentration. In addition, the top portion of the semiconductor fin 28 has a higher doping concentration. The high doping concentration present in both the side portion and top portion of the semiconductor fin 28 is shown in FIG. 3a with more shading as opposed to the right-hand side portion of the fin, which has a lower doping concentration. The channel region 20, the source region 16, the drain region 18, three gate dielectrics 30a, 30b, and 30c, and three gate conductors 12a, 12b and 12c form the asymmetric multi-gated transistor 11 (FIGS. 3a-3b).

The configuration of FIGS. 3a-3b results in three transistors of the tri-gated transistor 11, two transistors (i.e., one on the side and one on the top) of the tri-gated transistor 11 having a different threshold voltage (Vt) from the third remaining side transistor of the tri-gated transistor that has a low doping concentration. The transistors with the high Vt are suitable for use in low-power applications, while the transistor with the low Vt is suitable for use in high-performance applications. In this embodiment, the transistor 11 will have a high Vt when controlled by the first gate conductor 12a or the third gate conductor 12c and a low Vt when controlled by the second gate conductor 12b.

Figure 4A:
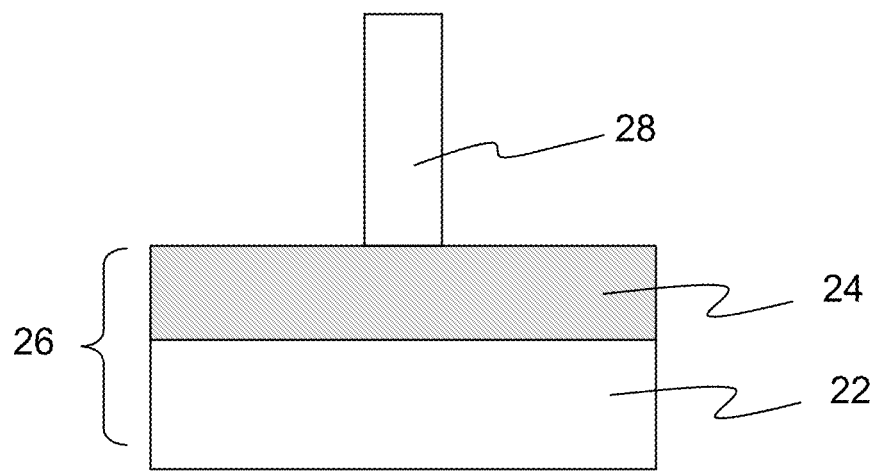
FIGS. 4a-4d show the method for forming the tri-gated transistor depicted in FIGS. 3a-3b.
Figure 4B:
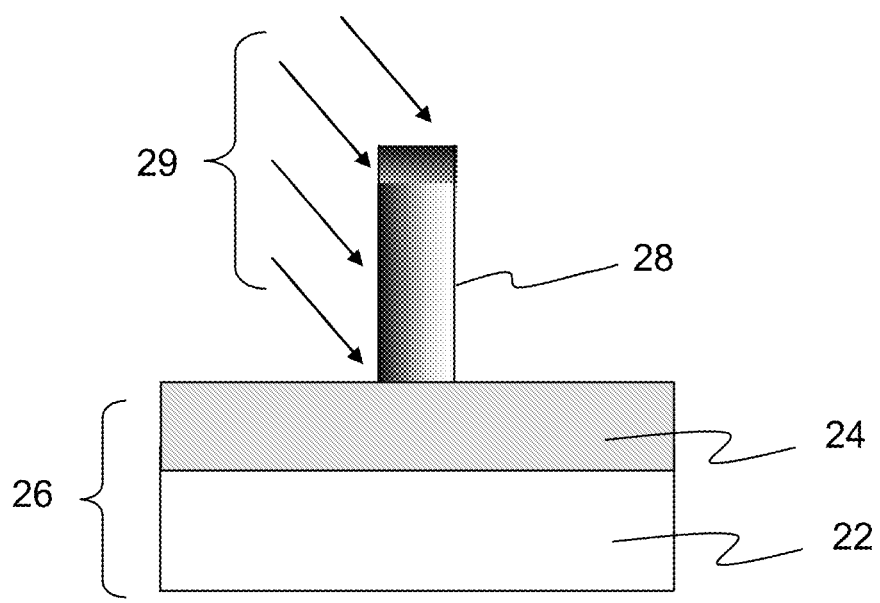

FIGS. 4a-4d show the method for forming the tri-gated transistor 11 depicted in FIGS. 3a-3b. The method for forming the tri-gated transistor 11 is similar to the method described with respect to FIGS. 2a-2d, except for a few differences. For instance, in FIG. 4a there is no capping layer formed on the top of the semiconductor fin 28 as there is in the transistor 10 shown in FIG. 2a. In this embodiment, there is only the semiconductor fin 28 formed on the substrate 26 comprising the substrate layer 22 and BOX layer 24. Another difference as shown in FIG. 4b, is that the angled implantation asymmetrically dopes the top portion of the semiconductor fin 28 with a semiconductor dopant, in addition to the one side portion of the fin. As a result, the top portion and the side portion of the semiconductor fin that receive the angled implant will have a high doping concentration and the side portion of the fin that does not receive the angled implantation will have a lower doping concentration. Depending on doping method, an optional activation process can be performed to activate the dopant in the semiconductor fin. The activation process may comprise performing a thermal anneal process such as rapid thermal anneal, furnace anneal, and laser anneal. Alternatively, an irradiation process such as ultraviolet (UV) irradiation can be used to activate the dopant.

Figure 4C:
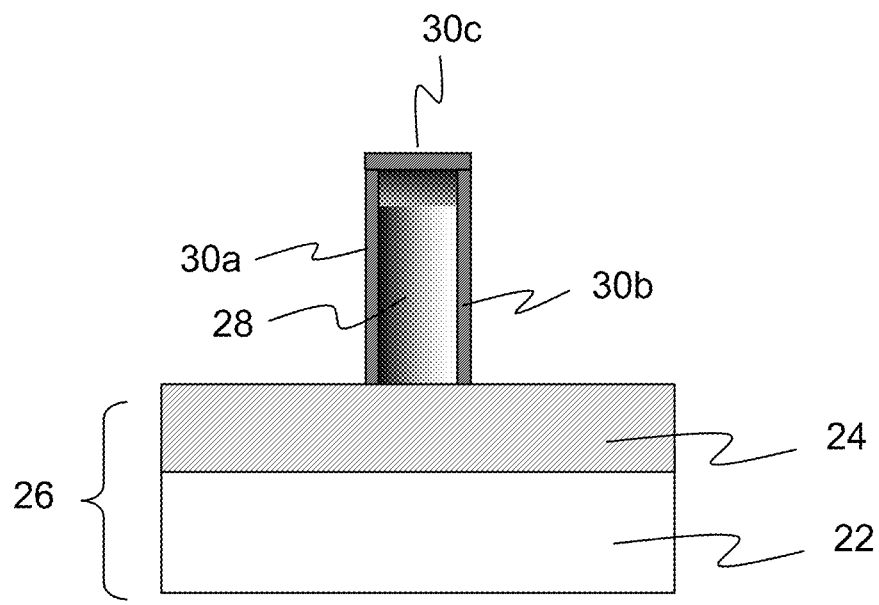
Figure 4D:
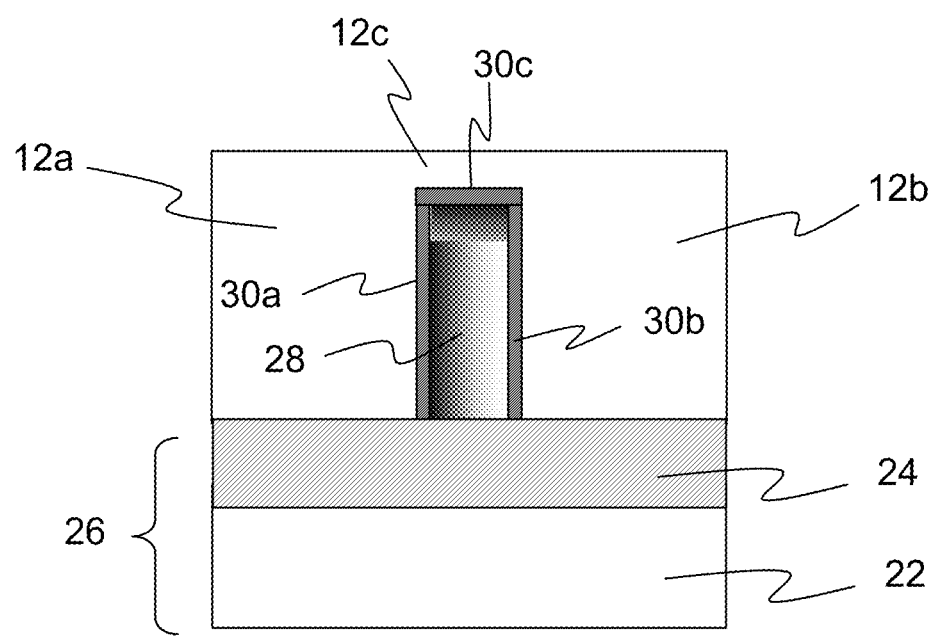

An additional difference as shown in FIG. 4c, is that the third gate dielectric 30c has replaced the capping layer 32 of the structure shown in FIG. 2c. The third gate dielectric 30c is similar to the first and second gate dielectrics 30a and 30b and thus can comprise a dielectric material which can include SiO$_2$, silicon oxynitride, silicon nitride or a high-k dielectric material. In addition, the gate dielectric 30c can have a thickness that is similar to the thickness ranges described above for gate dielectrics 30a and 30b and can be formed in a similar manner. A final difference between the method described in FIGS. 4a-4d and FIGS. 2a-2d, is that FIG. 4d shows the third gate conductor 12c. The third gate conductor 12c can comprise the same conducting material as described with respect to gate conductors 12a and 12b and have the same height and thickness ranges as described above. In addition, the third gate conductor 12c can be formed in the same manner as gate conductors 12a and 12b.

Like the asymmetric multi-gated transistor 10, the tri-gated transistor 11 (FIGS. 3a-3b) is formed by performing additional processing operations on the structure shown in FIG. 4d. For instance, in one embodiment, conventional patterning (i.e., lithography) and etching remove unnecessary material from the structure shown to form a source region and drain region. After performing these processing operations, a conventional doping process such as ion implantation is performed to form the source 16 and drain 18 (FIG. 3b). In one embodiment, the dopant implanted into the source 16 (FIG. 3b) and drain 18 (FIG. 3b) has the opposite polarity to the dopant incorporated into the semiconductor fin 28. The result is the asymmetric multi-gated transistor 11 shown in FIG. 3b.

Figure 5A:
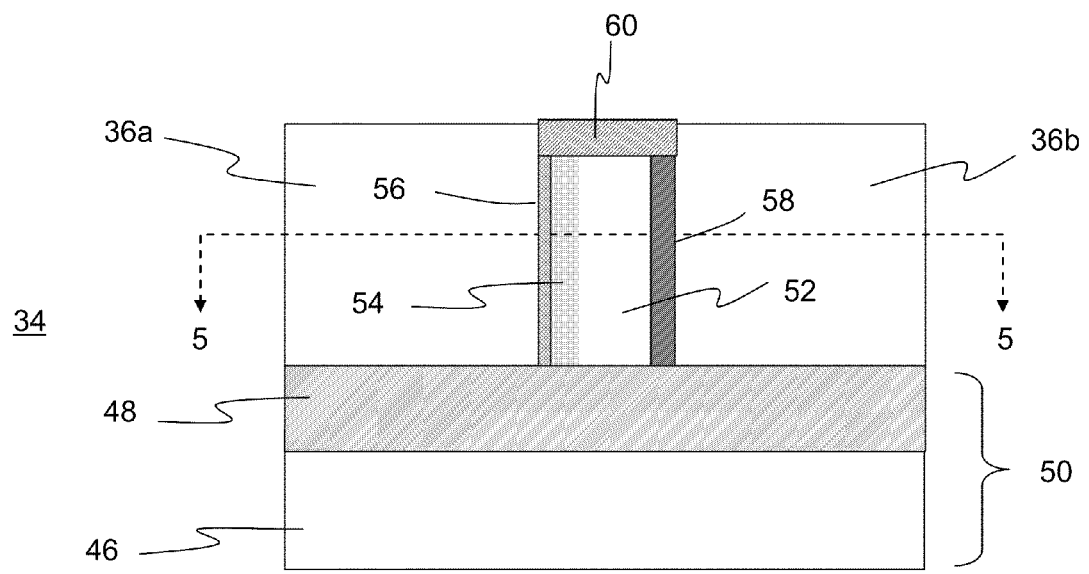
FIGS. 5a-5b show a cross-sectional and top view, respectively, of an asymmetric multi-gated transistor according to a third embodiment of this disclosure.
Figure 5B:
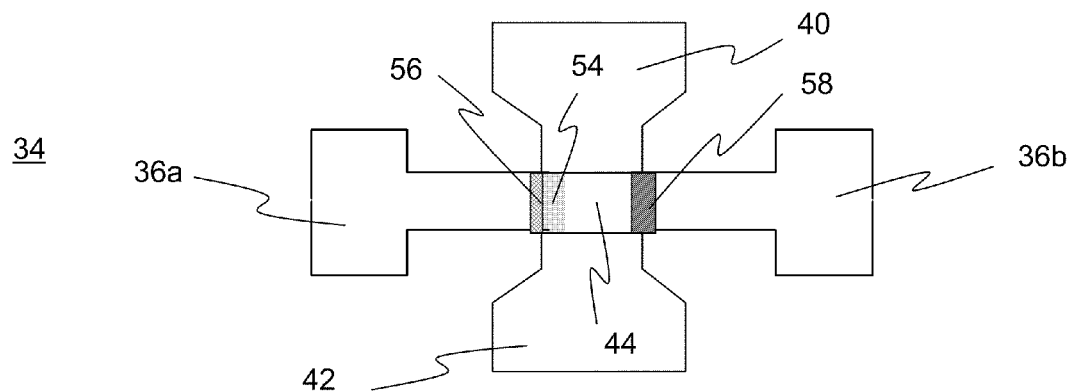

FIGS. 5a-5b shows an asymmetric multi-gated transistor 34 according to a third embodiment of this disclosure. The asymmetric multi-gated transistor 34 is asymmetric because there are gate dielectrics formed on the semiconductor fin that vary in thickness. In particular, one side portion of the semiconductor fin has a thin gate dielectric formed thereon while an opposite side portion of the fin has a thick gate dielectric formed thereon. The side transistor of the asymmetric multi-gated transistor 34 that is formed on the thin gate dielectric will have a low Vt, while the other side transistor of the asymmetric multi-gated transistor 34 that is formed on the thick gate dielectric will have a high Vt. The side transistor of the asymmetric multi-gated transistor 34 with the low Vt is suitable for use in high-performance applications, while the side transistor with the high Vt is suitable for use in low-power applications.

Referring back to the drawings, FIG. 5a shows a cross-sectional view of the asymmetric multi-gated transistor 34. In FIG. 5a, the asymmetric multi-gated transistor 34 is formed on a semiconductor-on-insulator (SOI) substrate which comprises a substrate layer 46 similar to the substrate layer 22 in FIG. 1b, a buried oxide (BOX) layer 48 similar to the BOX layer 24 in FIG. 1b, and a semiconductor layer atop of the BOX layer 48 (not shown), similar to the semiconductor layer in which the semiconductor fin 52 is formed as described in the first embodiment. The substrate layer 46 and the BOX layer 48 form a substrate 50 in which the additional layers of the asymmetric multi-gated transistor 34 are formed on.

As shown in FIG. 5a, the asymmetric multi-gated transistor 34 further comprises a semiconductor fin 52 formed on the substrate 50. In one embodiment, the semiconductor fin 52 comprises a material similar to the semiconductor fin 28 described above in the first embodiment. An implant material 54 is incorporated into one side portion of the semiconductor fin 52. FIG. 5a illustrates the implant material 54 on the left-hand side portion of the semiconductor fin 52, however, this location is not limiting to where one can implant the implant material. In one embodiment, the implant material 54 comprises a material, including but not limited to, hydrogen (H), deuterium (D), nitrogen (N), helium (He), neon (Ne), argon (Ar), krypton (Kr), xenon (Xe), carbon (C), oxygen (O), fluorine (F), phosphorus (P), arsenic (As), antimony (Sb), boron (B), indium (In), and thallium (Tl).

The growth rate of the gate dielectric formed on the semiconductor fin 52 can be enhanced or reduced depending on the selected implant material. For example, when silicon oxide grows on a silicon substrate doped with nitrogen, the growth rate of silicon oxide is reduced in comparison with the growth rate on an undoped silicon substrate. On the other hand, incorporating fluorine into the silicon substrate enhances the growth rate of silicon oxide. In one embodiment, a thicker gate dielectric has a thickness that ranges from about 10 angstroms to about 100 angstroms while a thinner gate dielectric has a thickness that is about 2 angstroms to 20 angstroms thinner than the thicker gate dielectric.

FIG. 5a shows a first gate dielectric 56 and second gate dielectric 58 formed on the semiconductor fin 52. The first gate dielectric 56 is formed on the sidewall of the side portion of the semiconductor fin 52 having the implant material 54, while the second gate dielectric 58 is formed on the sidewall of the side portion opposite the side portion with the implant material. Formed above the semiconductor fin 52 is a capping layer 60 which is similar to the capping layer 32 described in the first embodiment. The capping layer 60 aids in pattern optimization and protects the semiconductor fin 52 during subsequent processing.

Formed on the substrate 50, on one side of the first gate dielectric 56 and the capping layer 60 is the first gate conductor 36a, while on the other side of the second gate dielectric 58 and the capping layer is the second gate conductor 36b. In FIG. 5a, since the left-hand side portion of the semiconductor fin 52 has the thinner gate dielectric 56 as compared to the right-hand side portion of the fin, the transistor 34 will have a low Vt when controlled by the first gate conductor 36a and a high Vt when controlled by the second gate conductor 36b.

FIG. 5b shows a top view of the asymmetric multi-gated transistor 34 taken along cut line 5-5 shown in FIG. 5a. FIG. 5b shows that the semiconductor fin 52 comprises a channel region 44, a source region 40 and a drain region 42. The channel region 44, the source region 40, the drain region 42, two gate dielectrics 56 and 58, and two gate conductors 36a and 36b form the asymmetric multi-gated transistor 34.

Figure 6A:
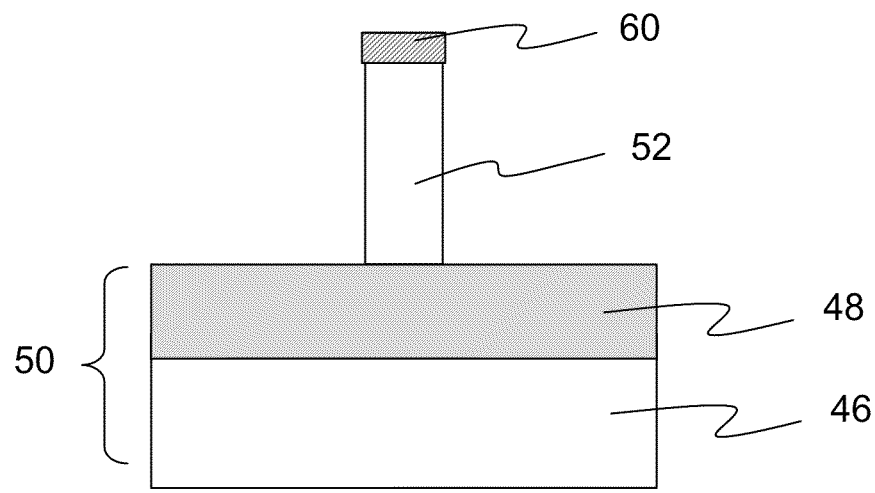
FIGS. 6a-6d show the method for forming the asymmetric multi-gated transistor depicted in FIGS. 5a-5b.

FIGS. 6a-6d show the method for forming the asymmetric multi-gated transistor 34 depicted in FIGS. 5a-5b. As shown in FIG. 6a, the semiconductor fin 52 with capping layer 60 is formed on a SOI substrate with a BOX layer 48 and a substrate layer 46. The structure in FIG. 6a is the same as the structure in FIG. 2a. Method for forming such a structure is similar to the method described above in the first embodiment.

Figure 6B:
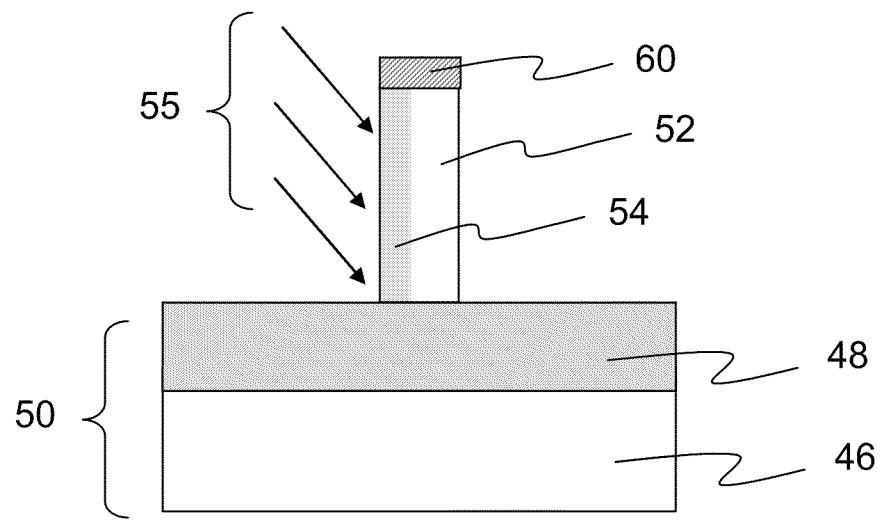

FIG. 6b shows the structure from FIG. 6a being implanted with the implant material 54. As indicated by the arrows 55 shown in FIG. 6b, a side portion of the semiconductor fin 52 receives an angled implantation of the implant material. In one embodiment, the implant material 54 comprises a material selected from the group consisting of hydrogen (H), deuterium (D), nitrogen (N), helium (He), neon (Ne), argon (Ar), krypton (Kr), xenon (Xe), carbon (C), oxygen (O), fluorine (F), phosphorus (P), arsenic (As), antimony (Sb), boron (B), indium (In), and thallium (Tl). The selected implant material will determine the growth or oxidation rate of gate dielectric 56 and gate dielectric 58 on the semiconductor fin 52 and the thickness of each oxide. For example, if nitrogen is used as the implant material 54, then the growth rate of a $SiO_2$ gate dielectric on the side portion of the semiconductor fin 52 that has been implanted with the nitrogen will be lower than the side of the fin without the nitrogen. As a result, the thickness of the gate dielectric on the side portion of the semiconductor fin 52 that has been implanted with the nitrogen will be thinner than the thickness of the gate dielectric on the side of the fin without the nitrogen.

In another embodiment, if fluorine is used as the implant material 54, then the growth rate of a $SiO_2$ gate dielectric on the side portion of the semiconductor fin 52 that has been implanted with the fluorine will be higher than the side of the fin without the fluorine. As a result, the thickness of the gate dielectric on the side portion of the semiconductor fin 52 that has been implanted with the fluorine will be thicker than the thickness of the gate dielectric on the side of the fin without fluorine. Yet in another embodiment, if fluorine is used as the implant material 54, then the deposition rate of a high-k dielectric such as hafnium oxide or hafnium silicate on the side portion of the semiconductor fin 52 that has been implanted with fluorine will be lower than the side of the fin without fluorine. As a result, the thickness of the gate dielectric on the side portion of the semiconductor fin 52 that has been implanted with fluorine will be thinner than the thickness of the gate dielectric on the side of the fin without fluorine.

Alternative methods instead of angle ion implantation can also be used to asymmetrically dope the semiconductor fin 28. For example, a protection layer such as a silicon nitride layer can be formed on one side portion of the semiconductor fin 28 and a semiconductor dopant is incorporated into the opposite side portion which is exposed by existing or future developed doping techniques, including but not limited to, ion implantation, gas phase doping, plasma doping, plasma immersion ion implantation, infusion doping, liquid phase doping, and solid phase doping.

Depending on doping method, an optional activation process can be performed to activate the dopant in the semiconductor fin. The activation process may comprise performing a thermal anneal process such as rapid thermal anneal, furnace anneal, and laser anneal. Alternatively, an irradiation process such as ultraviolet (UV) irradiation can be used to activate the dopant.

The amount of implant material implanted into the semiconductor fin 52 to fabricate the asymmetric multi-gated transistor 34 will vary and depend on the implant selected and the application of the transistor. In one embodiment, the amount of dopant implanted into the semiconductor fin 52 is on the order preferably from about 1E17 $cm^{-3}$, to 1E21 $cm^{-3}$, more preferably from 1E18 $cm^{-3}$ to 1E20 $cm^{-3}$, and most preferably from 5E18 $cm^{-3}$ to 2E19 $cm^{-3}$.

Figure 6C:
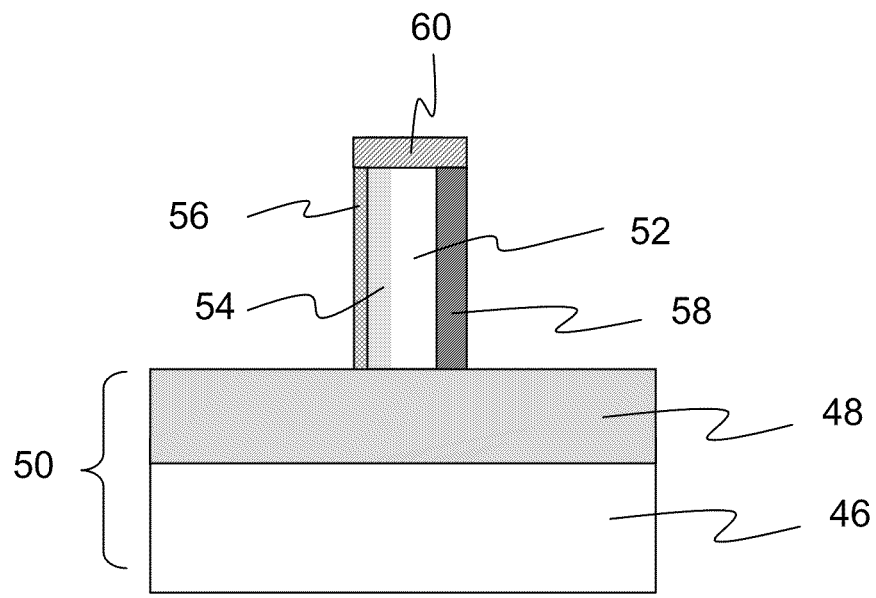

FIG. 6c shows the structure from FIG. 6b with the first gate dielectric 56 and second gate dielectric 58 formed on the semiconductor fin 52. The first gate dielectric 56 is formed on the sidewall of the side portion of the semiconductor fin 52 having the implant material 54, while the second gate dielectric 58 is formed on the sidewall of the side portion of the fin opposite the implant material. In one embodiment, first gate dielectric 56 and second gate dielectric 58 comprise a dielectric material which can include silicon oxide, silicon nitride, silicon oxynitride, high-k (high dielectric constant) material having a relative permittivity above about 7, or any combination of these materials. Examples of high-k material include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, an any combination of these materials. In one embodiment, the thicker gate dielectric 58 has a thickness that ranges from about 10 angstroms to about 100 angstroms while the thinner gate dielectric 56 has a thickness that is about 2 angstroms to 20 angstroms less than the thickness of gate dielectric 58

The gate dielectric 56 and gate dielectric 58 are formed simultaneously on the semiconductor fin 52 by a conventional growth or deposition methods. For example, when the dielectric 56 and 58 comprises silicon oxide, silicon nitride, or silicon oxynitride, a thermal oxidation or nitridation can be used. As mentioned above, the growth rate and thickness of the dielectric 56 and 58 on the semiconductor fin 52 will depend on the implant material implanted into the fin. When dielectric 56 and 58 comprises a high-k dielectric such as hafnium oxide or hafnium silicate, atomic layer deposition (ALD) or metalorganic chemical vapor deposition (MOCVD) can be used. As mentioned above, the deposition rate and thickness of the dielectric 56 and 58 on the semiconductor fin 52 will depend on the implant material implanted into the fin.

Figure 6D:
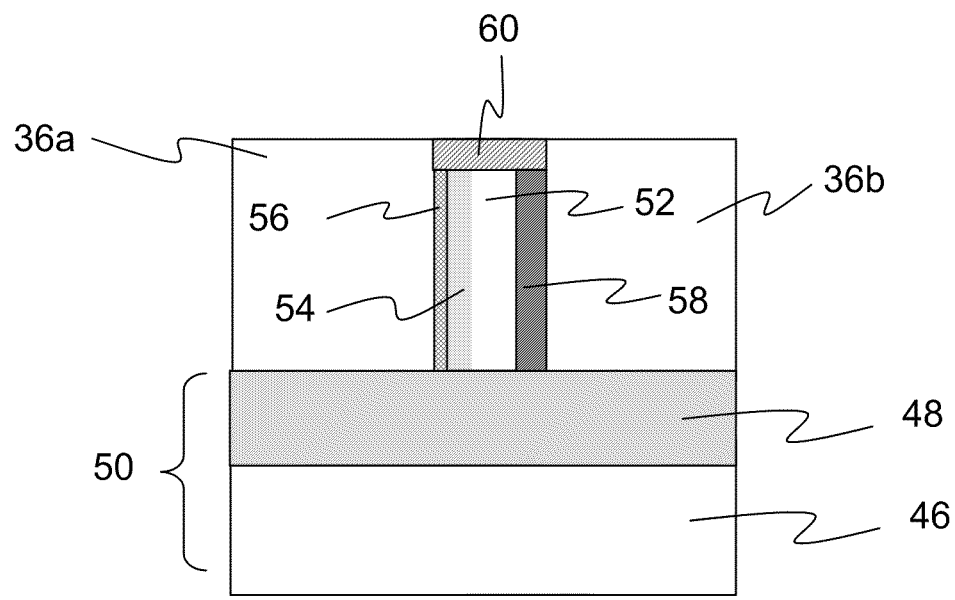

FIG. 6d shows the structure from FIG. 6c with the first gate conductor 36a and the second gate conductor 36b formed on the substrate 50, gate dielectrics 56 and 58 and the capping layer 60. The first gate conductor 36a and second gate conductor 36b may comprise the same or different conducting materials, similar to the first gate conductor 12a and second gate conductor 12b described above in the first embodiment After depositing the first gate conductor 36a and the second gate conductor 36b, similar processing operations to the processing operations for forming the asymmetric multi-gated transistor 10 in the first embodiment are performed on the structure in FIG. 6d in order to obtain the asymmetric multi-gated transistor 34 For instance, in one embodiment, conventional patterning (i.e., lithography) and etching remove unnecessary material from the structure shown to form a source region and drain region. After performing these processing operations, a conventional doping process such as ion implantation is performed to form the source 40 and drain 42. In one embodiment, the dopant implanted into the source 40 and drain 42 has the opposite polarity to the dopant incorporated into the semiconductor fin 52. The result is the asymmetric multi-gated transistor 34 shown in FIG. 5a.

Figure 7A:
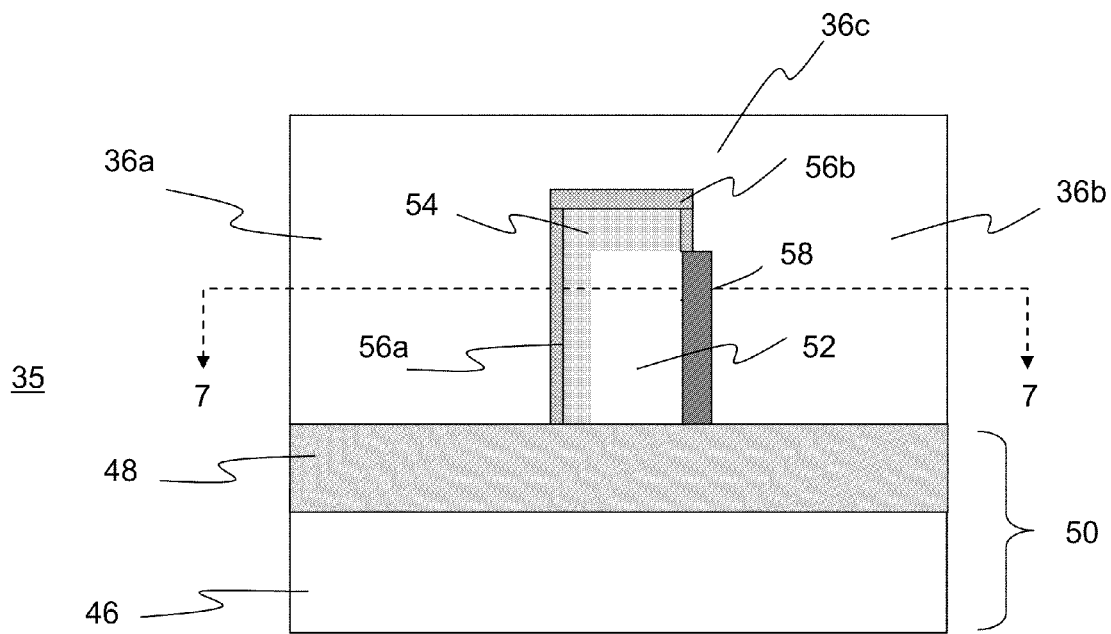
FIGS. 7a-7b show a cross-sectional and top, respectively, of an asymmetric multi-gated transistor according to a fourth embodiment of this disclosure.
Figure 7B:
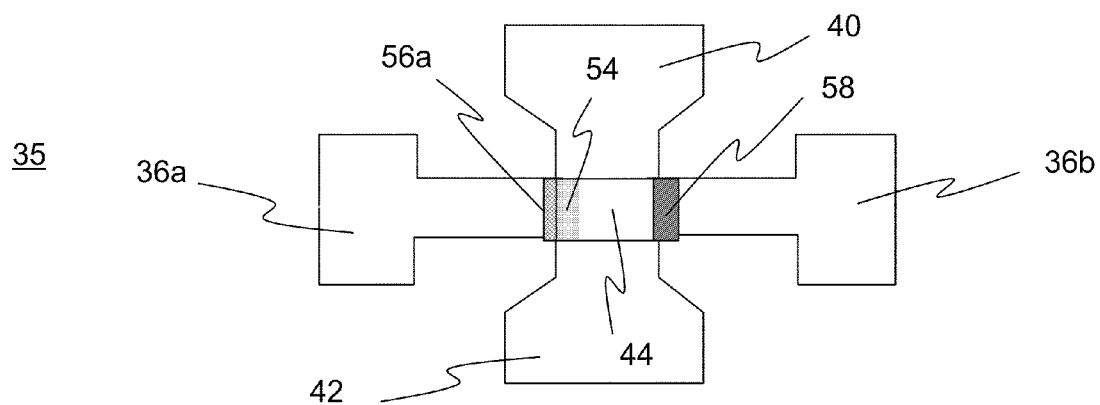

FIGS. 7a-7b show a fourth embodiment of an asymmetric multi-gated transistor. In particular, FIGS. 7a-7b show a tri-gated transistor 35 with gate dielectrics of varying thickness. The tri-gated transistor 35 is similar to the asymmetric multi-gated transistor 34 of FIGS. 5a-5b, except that transistor 35 has three gate conductors 36a, 36b and 36c and three gate dielectrics 56a, 56b and 58 (see FIGS. 7a-7b). The semiconductor fin 52 comprises a channel region 44, a source region 40 and a drain region 42. The channel region 44, the source region 40, the drain region 42, three gate dielectrics (56a, 56b and 58), and three gate conductors (36a, 36b and 36c) form the asymmetric multi-gated transistor 34 (FIGS. 7a-7b). The material, thickness and formation techniques for gate conductor 36c and gate dielectric 56b are similar to gate conductors 36a, 36c and gate dielectric 56a, respectively. Also, in this embodiment, the capping layer 60 of the transistor 34 shown in FIGS. 5a-5b has been replaced with the additional gate dielectric 56b. Another difference is that the semiconductor fin 52 has one side portion and a top portion implanted with an implant material 54.

In this embodiment, gate dielectrics 56a and 56b, which are formed on the portions of the semiconductor fin having implant material, are thin gate dielectrics while gate dielectric 58 formed on the portion of the fin with no implant material is a thick dielectric. The gate conductors of the tri-gated transistor 35 that are formed on the thin gate dielectrics will have a low Vt, while the gate conductor of the tri-gated transistor 35 that is formed on the thick gate dielectric will have a high Vt. The gate conductors of the tri-gated transistor 35 with the low Vt are suitable for use in high-performance applications, while the gate conductor with the high Vt is suitable for use in low-power applications.

Figure 8A:
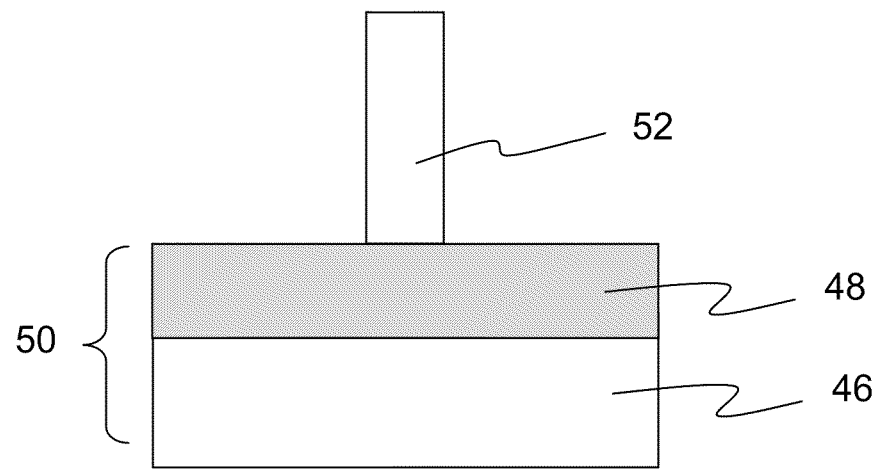
FIGS. 8a-8d show the method for forming the tri-gated transistor depicted in FIGS. 7a-7b.
Figure 8B:
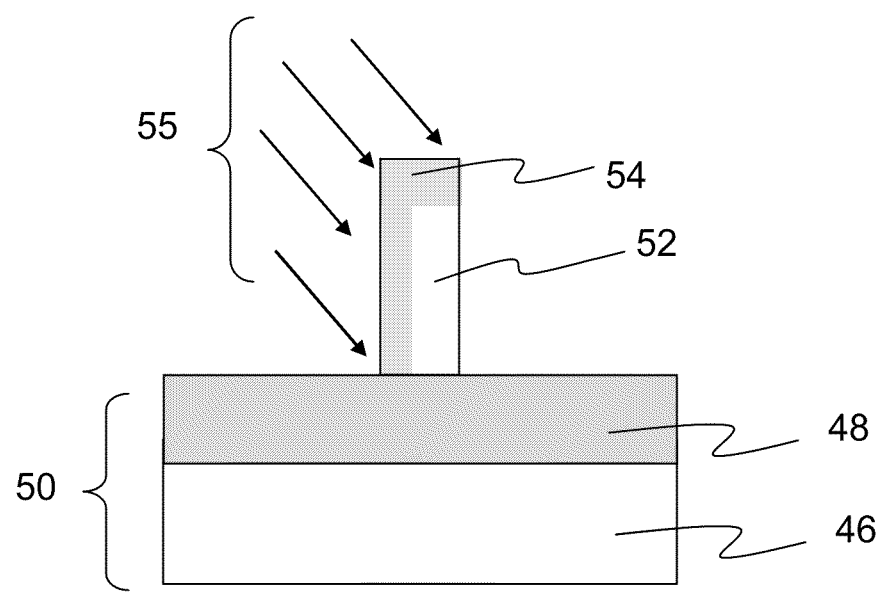

FIGS. 8a-8d show the method for forming the tri-gated transistor 35 depicted in FIGS. 7a-7b. The method for forming the tri-gated transistor 35 is similar to the method described with respect to FIGS. 6a-6d, except for a few differences. For instance, in FIG. 8a there is no capping layer formed on the top of the semiconductor fin 52 as there is in the transistor 34 shown in FIG. 6a. In this embodiment, there is only the semiconductor fin 52 formed on the substrate 50 comprising the substrate layer 46 and BOX layer 48. Another difference as shown in FIG. 8b, is that the angled implantation asymmetrically implants the top portion of the semiconductor fin 52 with an implant material, in addition to the one side portion of the fin. As mentioned above for transistor 34, the implant material may comprise a material selected from the group consisting of hydrogen (H), deuterium (D), nitrogen (N), helium (He), neon (Ne), argon (Ar), krypton (Kr), xenon (Xe), carbon (C), oxygen (O), fluorine (F), phosphorus (P), arsenic (As), antimony (Sb), boron (B), indium (In), and thallium (Tl).

Figure 8C:
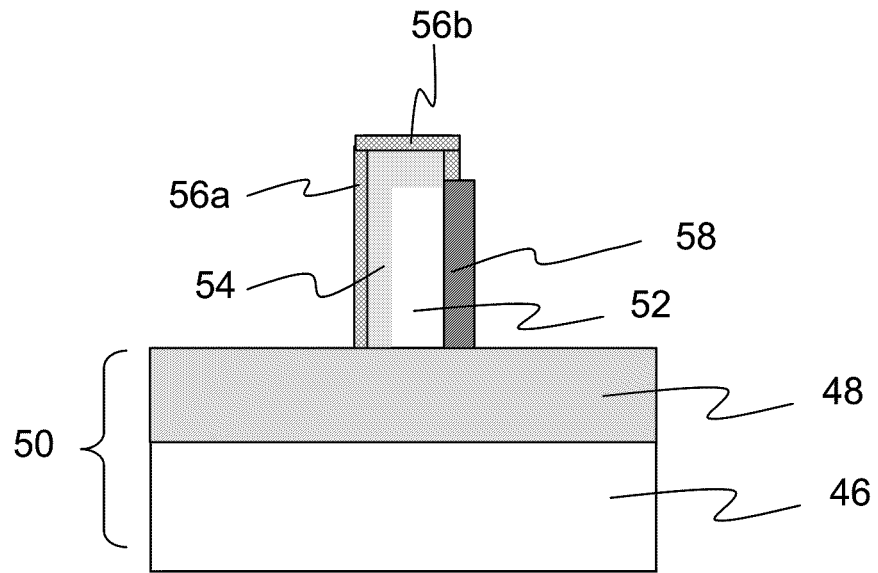

The selected implant material will determine the thickness and growth rate of the gate dielectrics 56a, 56b and 58 that are formed on the semiconductor fin 52. For example, if nitrogen is used as the implant material 54, then the growth rate of a $SiO_2$ gate dielectric on the top and side portion of the semiconductor fin 52 will be lower than the side of the fin without the implanted nitrogen. As a result, the thickness of the gate dielectric on the top and side portion of the semiconductor fin 52 will be thinner than the thickness of the gate dielectric on the side of the fin without the implanted nitrogen. FIG. 8c shows gate dielectrics 56a and 56b with a thin thickness, while gate dielectric 58 has a greater thickness. In another embodiment, if fluorine is used as the implant material 54, then the growth rate of gate dielectrics 56a, 56b and 58 will be different than if the implant material was nitrogen. As a result, the thickness of gate dielectrics 56a and 56b will be thicker than the thickness of the gate dielectric 58. Yet in another embodiment, if fluorine is used as the implant material 54, then the deposition rate of a high-k dielectric such as hafnium oxide or hafnium silicate on the side portion of the semiconductor fin 52 that has been implanted with fluorine will be lower than the side of the fin without fluorine. As a result, the thickness of the gate dielectric on the side portion of the semiconductor fin 52 that has been implanted with fluorine will be thinner than the thickness of the gate dielectric on the side of the fin without fluorine.

Alternative methods instead of angle ion implantation can also be used to asymmetrically dope the semiconductor fin 52. For example, a protection layer such as a silicon nitride layer can be formed on one side portion of the semiconductor fin 52 and a semiconductor dopant is incorporated into the opposite side portion which is exposed by existing or future developed doping techniques, including but not limited to, ion implantation, gas phase doping, plasma doping, plasma immersion ion implantation, infusion doping, liquid phase doping, and solid phase doping.

Depending on doping method, an optional activation process can be performed to activate the dopant in the semiconductor fin. The activation process may comprise performing a thermal anneal process such as rapid thermal anneal, furnace anneal, and laser anneal. Alternatively, an irradiation process such as ultraviolet (UV) irradiation can be used to activate the dopant.

Figure 8D:
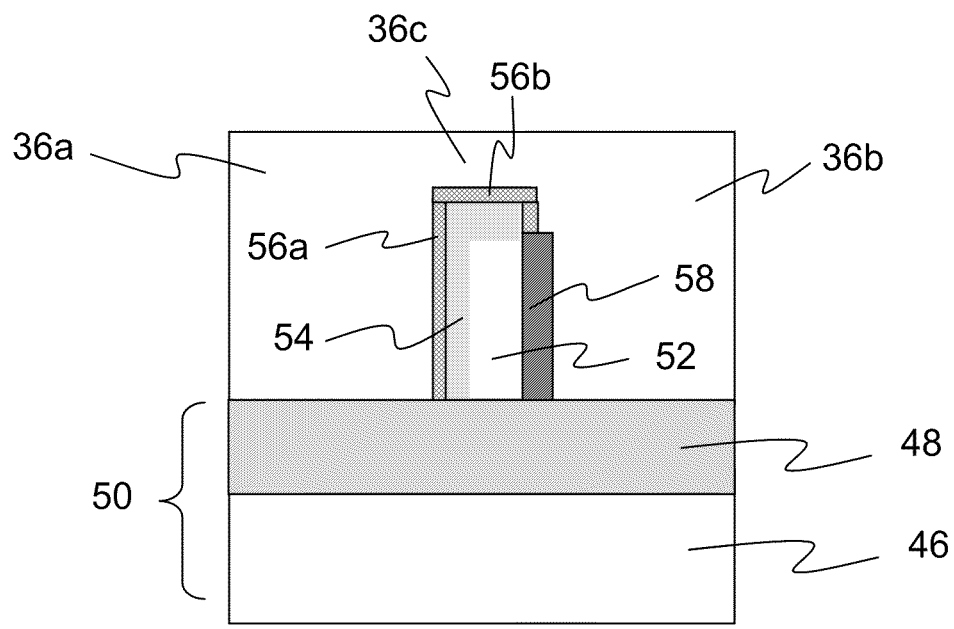

Like the asymmetric multi-gated transistor 34, the tri-gated transistor 35 is formed by performing additional processing operations on the structure shown in FIG. 8d. For instance, in one embodiment, conventional patterning (i.e., lithography) and etching remove unnecessary material from the structure shown to form a source region and drain region. After performing these processing operations, a conventional doping process such as ion implantation is performed to form the source 40 and drain 42. In one embodiment, the dopant implanted into the source 40 and drain 42 has the opposite polarity to the dopant incorporated into the semiconductor fin 52. The result is the asymmetric multi-gated transistor 35 shown in FIG. 7b.

Asymmetric multi-gated transistors 10, 11, 34 and 35 and their respective methods for forming are improvements over currently used asymmetric multi-gated transistor for several reasons. First, the asymmetric multi-gated transistor is formed by simply performing an asymmetrical doping process to asymmetrically incorporate the dopant into the semiconductor fine. Therefore, process complexity is reduced and process cost is lowered. Second, no extra masking level is needed to form the asymmetric multi-gated transistor. Therefore, overlay issues associated with lithography are eliminated. Finally, the gate dielectric is formed simultaneously on all exposed sidewalls of the semiconductor fin, which further reduces the process complexity and lowers the process cost.

In one embodiment, the asymmetric multi-gated transistors 10, 11, 34 and 35 as described above may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described above for forming the asymmetric multi-gated transistors 10, 11, 34 and 35 may be used in the fabrication of integrated circuit chips that utilize such transistors.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is apparent that there has been provided with this disclosure, an asymmetric multi-gated transistor and method for forming. While the disclosure has been particularly shown and described in conjunction with a preferred embodiment thereof, it will be appreciated that a person of ordinary skill in the art can effect variations and modifications without departing from the scope of the disclosure.

What is claimed is:

1. An asymmetric multi-gated transistor, comprising:
a substrate;
a semiconductor fin formed on the substrate, wherein the semiconductor fin is asymmetrically doped with a semiconductor dopant, wherein a first side portion of the fin has a high doping concentration and a second side portion opposite therefrom has a lower doping concentration;
a gate dielectric formed on the fin, wherein the gate dielectric comprises a first gate dielectric formed on the first side portion of the fin having a high doping concentration and a second gate dielectric formed on the second side portion of the fin having a lower doping concentration, wherein the first gate dielectric formed on the first side portion of the fin having a high doping concentration has a thickness that differs from the thickness of the second gate dielectric formed on the side portion of the fin having a lower doping concentration, wherein the first gate dielectric extends only along the first side portion of the semiconductor fin from the substrate up to a top portion of the semiconductor fin, and the second gate dielectric extends only along the second side portion of the semiconductor fin from the substrate up to the top portion of the semiconductor fin;

a first gate conductor formed on the first gate dielectric; and a second gate conductor formed on the second gate dielectric.

2. The transistor according to claim 1, wherein the semiconductor dopant comprises a dopant selected from the group consisting of hydrogen (H), deuterium (D), nitrogen (N), helium (He), neon (Ne), argon (Ar), krypton (Kr), xenon (Xe), carbon (C), oxygen (O), fluorine (F), phosphorus (P), arsenic (As), antimony (Sb), boron (B), indium (In), and thallium (Tl).

3. The transistor according to claim 1, wherein the side portion of the fin with a high doping concentration has a higher threshold voltage when controlled by the first gate conductor and the portion of the fin with a lower doping concentration has a lower threshold voltage when controlled by the second gate conductor.

4. The transistor according to claim 1, wherein the first side portion of the fin having a high doping concentration comprises a dopant amount that ranges from about $1E17$ cm$^{-3}$ to $1E21$ cm$^{-3}$.

5. The transistor according to claim 4, wherein the dopant amount ranges from about $1E18$ cm$^{-3}$ to about $1E20$ cm$^{-3}$.

6. The transistor according to claim 5, wherein the dopant amount ranges from about from $5E18$ cm$^{-3}$ to $2E19$ cm$^{-3}$.

7. The transistor according to claim 1, wherein the gate dielectric from the first gate dielectric or second gate dielectric that has the greater thickness, comprises a thickness that ranges from about 10 angstroms to about 100 angstroms.

8. The transistor according to claim 1, wherein the gate dielectric from the first gate dielectric or second gate dielectric that has the lesser thickness, comprises a thickness that ranges from about 2 angstroms to about 20 angstroms.

9. An integrated circuit on a semiconductor on insulator chip comprising the transistor of claim 1.

10. The transistor according to claim 1, further comprising a capping layer disposed above the first gate dielectric, the semiconductor fin and the second gate dielectric, the capping layer evenly covering the top portion of each of the first gate dielectric, the semiconductor fin and the second gate dielectric, wherein the capping layer is coplanar with each of the top portion of the first gate dielectric, the semiconductor fin and the second gate dielectric.

11. A method for forming an asymmetric multi-gated transistor, comprising:

forming a semiconductor fin on a substrate;

incorporating a first side portion of the semiconductor fin with an implant material;

growing a gate dielectric on the semiconductor fin, wherein the first side portion of the semiconductor fin with the implant material grows a first gate dielectric with a thickness that differs from a thickness of a second gate dielectric that grows on a second side portion of the semiconductor fin, wherein the first gate dielectric extends only along the first side portion of the semiconductor fin from the substrate up to a top portion of the semiconductor fin, and the second gate dielectric extends only along the second side portion of the semiconductor fin from the substrate up to the top portion of the semiconductor fin;

forming a first gate conductor on the first gate dielectric; and forming a second gate conductor on the second gate dielectric.

12. The method according to claim 11, wherein the implant material in the semiconductor fin determines a difference in thickness between the first gate dielectric and the second gate dielectric.

13. The method according to claim 11, wherein the implant material comprises a dopant selected from the group consisting of hydrogen (H), deuterium (D), nitrogen (N), helium (He), neon (Ne), argon (Ar), krypton (Kr), xenon (Xe), carbon (C), oxygen (O), fluorine (F), phosphorus (P), arsenic (As), antimony (Sb), boron (B), indium (In), and thallium (Tl).

14. The method according to claim 11, wherein the incorporating of the first side portion of the semiconductor fin with the implant material comprises implanting a dopant amount that ranges from about $1E17$ cm$^{-3}$ to $1E21$ cm$^{-3}$.

15. The method according to claim 14, wherein the dopant amount ranges from about $1E18$ cm$^{-3}$ to about $1E20$ cm$^{-3}$.

16. The method according to claim 15, wherein the dopant amount ranges from about from $5E18$ cm$^{-3}$ to $2E19$ cm$^{-3}$.

17. The method according to claim 11, wherein the gate dielectric from the first gate dielectric or second gate dielectric that has the greater thickness, comprises a thickness that ranges from about 10 angstroms to about 100 angstroms.

18. The method according to claim 11, wherein the gate dielectric from the first gate dielectric or second gate dielectric that has the lesser thickness, comprises a thickness that ranges from about 2 angstroms to about 20 angstroms.

19. The method according to claim 11, further comprising forming a capping layer disposed above the first gate dielectric, the semiconductor fin and the second gate dielectric, the capping layer evenly covering the top portion of each of the first gate dielectric, the semiconductor fin and the second gate dielectric, wherein the capping layer is coplanar with each of the top portion of the first gate dielectric, the semiconductor fin and the second gate dielectric.

* * * * *